United States Patent [19]
Hoshino

[11] Patent Number: 5,242,838
[45] Date of Patent: Sep. 7, 1993

[54] METHOD OF MANUFACTURING A SEMICONDUCTOR DEVICE

[75] Inventor: Hitoshi Hoshino, Tokyo, Japan

[73] Assignee: NEC Corporation, Japan

[21] Appl. No.: 916,396

[22] Filed: Jul. 20, 1992

[30] Foreign Application Priority Data

Jul. 24, 1991 [JP] Japan .................................. 3-182847

[51] Int. Cl.$^5$ .......................................... H01L 21/66
[52] U.S. Cl. .................................. 437/8; 437/207; 437/209; 437/214; 437/217; 437/220
[58] Field of Search ............... 437/209, 207, 211, 214, 437/217, 220, 8

[56] References Cited

U.S. PATENT DOCUMENTS

| | | | |
|---|---|---|---|
| 4,716,124 | 12/1987 | Yerman et al. | 437/209 |
| 4,874,722 | 10/1989 | Bednarz et al. | 437/209 |
| 4,985,988 | 1/1991 | Littlebury | 437/217 |
| 5,094,982 | 3/1992 | Suzuki et al. | 437/209 |
| 5,133,118 | 7/1992 | Lindblad et al. | 437/207 |
| 5,139,973 | 8/1992 | Nagy et al. | 437/220 |

*Primary Examiner*—Brian E. Hearn
*Assistant Examiner*—Kevin M. Picardat
*Attorney, Agent, or Firm*—Laff, Whitesel, Conte & Saret

[57] ABSTRACT

A semiconductor chip 4 is fixed to an island portion 16 of a lead frame, an electrode pad 22 of the semiconductor chip and the inner end portion of an external lead 18 of the lead frame are connected with an electrically conductive thin wire 24 and the semiconductor chip 4 is sealed with plastic together with the island portion 16 and the inner end portion of the external lead 18. The external lead 18 is cut off and isolated from the frame portion 12 and, with the island portion 16 retained by the frame portion 12 via a connecting portion 14, the external lead 18 is made to contact a measuring terminal 10 of the testing machine to carry out the electrical characteristic test of the semiconductor chip 4. Thereafter, the connecting portion 14 is cut off to remove the frame portion 12. After the removal, or simultaneously with that, the external lead 18 may be formed.

According to this method, since the external lead is left rectilinear and, separated from the external lead, the frame portion is attached to carry out the test, the danger of the external lead being deformed is remarkably small and, further, the electrical contact with the test can be excellently maintained.

4 Claims, 4 Drawing Sheets

METHOD OF MANUFACTURING A SEMICONDUCTOR DEVICE

FIELD OF THE INVENTION

The present invention relates to a method of manufacturing plastic-packaged semiconductor device and, in particular, to a method of manufacturing the same suitable for implementing a test on electrical characteristics thereof.

BACKGROUND OF THE INVENTION

Conventionally, in manufacturing a plastic-packaged semiconductor device, a semiconductor chip is fixed to an island portion of a lead frame, and an electrode pad of the semiconductor chip and the inner end portion of an external lead of the lead frame are connected by means of a metallic thin wire, the foregoing chip, island portion and the inner end portion of the external lead are sealed with a sealing plastic, the frame portion of the lead frame is cut off and removed and, thereafter, the external lead laterally protruding from the plastic material is bent into a form suitable for being mounted to the circuit substrate.

By the way, when the semiconductor device is manufactured, after packaged as described above, it is necessary to carry out the test on electrical characteristics. This test is carried out by fitting the semiconductor device to a measuring jig and making the measuring terminal of a testing machine contact the external lead.

According to a conventional manufacturing method, since the external lead is already formed at the time of this test, during handling, one can often touch the external lead, or the external lead can often come in contact with other members causing the external lead to be deformed by bending or the like. Such deformation of the external lead causes it to unexcellently come in contact with the measuring terminal of the testing machine thus making an exact characteristic test difficult to carry out. Further, according to the conventional manufacturing method, since the external lead is already formed at the time of the characteristic test, it is not possible to allow for a large contact area between the measuring terminal and the external lead when it is fitted to the measuring jig, which can readily cause the unexcellent electric contact.

SUMMARY OF THE INVENTION

Accordingly, an object of the present invention is to prevent deformation of the external lead which can occur at the time of the characteristic test in manufacturing the semiconductor device.

Another object of the present invention is to improve the handling properties of the semiconductor device when the characteristic test is carried out.

Still another object of the present invention is to excellently maintain the electrical connection between the external lead and the measuring terminal of the testing machine when the characteristic test is carried out to thereby improve the reliability of the test.

In order to achieve these ends, in the method of the present invention, as in the conventional method, first, the semiconductor chip is fixed to the island portion of the lead frame, the electrode pad of the semiconductor chip and the inner end portion of the external lead of the lead frame are connected by means of an electrically conductive wire to seal the semiconductor chip with plastic together with the island portion and the inner end portion of the external lead. The external lead is cut off and isolated from the frame portion and, with the island portion retained by the frame portion via a connecting portion, the external lead is made to contact the measuring terminal of the testing machine to carry out the test on the electrical characteristic of the semiconductor chip. Thereafter, the foregoing connecting portion is cut off to remove the frame portion.

In a preferred embodiment of the present invention, after the connecting portion is cut off and the frame portion is removed, the external lead is formed. In another embodiment of the present invention, the connecting portion is cut off and the frame portion is removed while at the same time the external lead is formed.

Further, in the present invention, at least one of the foregoing connecting portion may be cut off protruded from the sealing plastic material so that this protruding connecting portion may be used as an additional external lead.

According to the present invention, since the external lead remain rectilinear and the frame portion isolated from the external lead is attached to the device, to carry out the characteristic test, a danger of the external lead being deformed is remarkably small and, in particular, the electrical contact with the characteristic test can excellently be maintained. In addition, since, after the test, the frame portion is cut off and the external lead is formed, it is not necessary to work on ones recognized as unacceptable in the test, which allows an unnecessary work to be eliminated.

BRIEF DESCRIPTION OF THE DRAWINGS

FIG. 1B is a cross-sectional view taken along line B—B of FIG. 1A, FIG. 2B a cross-sectional view taken along line B—B of FIG. 2A and FIG. 3B a cross-sectional view taken along line B—B of FIG. 3A.

DETAILED DESCRIPTION OF THE PREFERRED EMBODIMENTS

A specific embodiment of the present invention is hereinafter described with reference to the accompanying drawings.

Figure 1A:
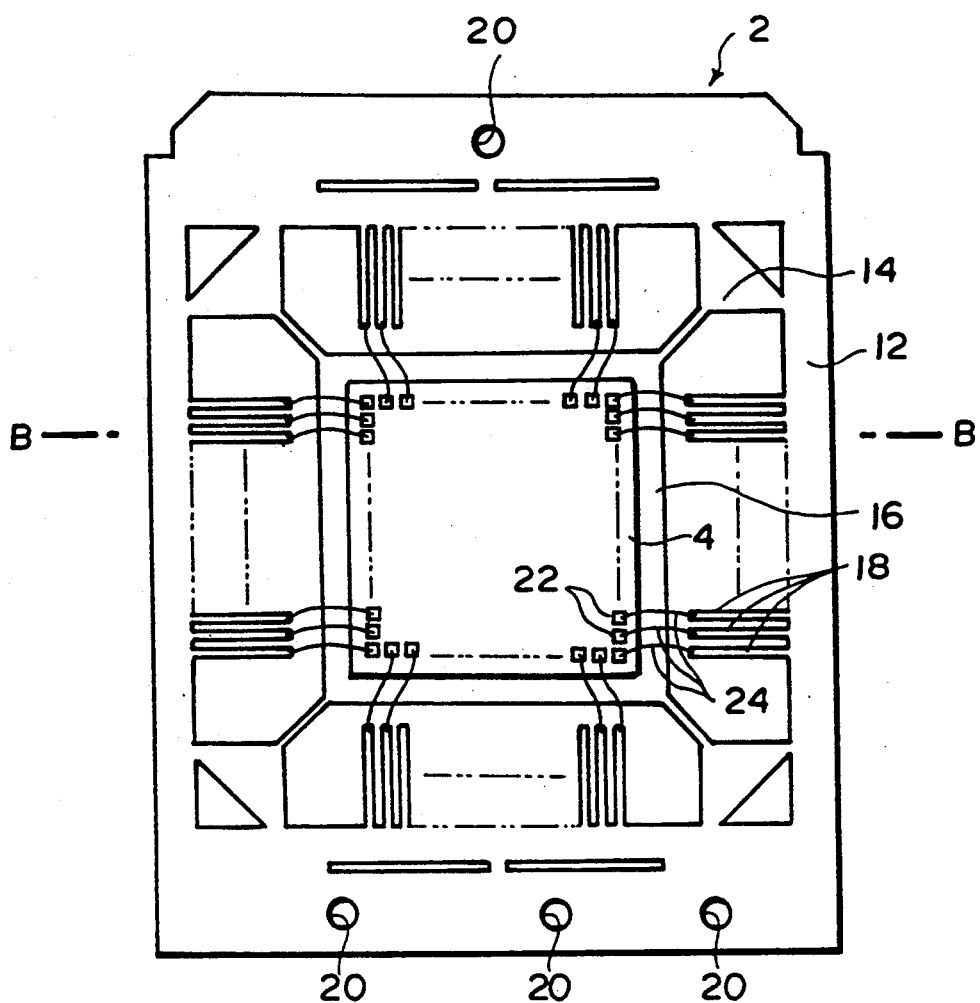
FIGS. 1A, 1B, 2A, 2B, 3A, 3B, 4, 5 and 6 are respectively a view illustrating a process of a specific embodiment of the present invention respectively. Here.
Figure 1B:
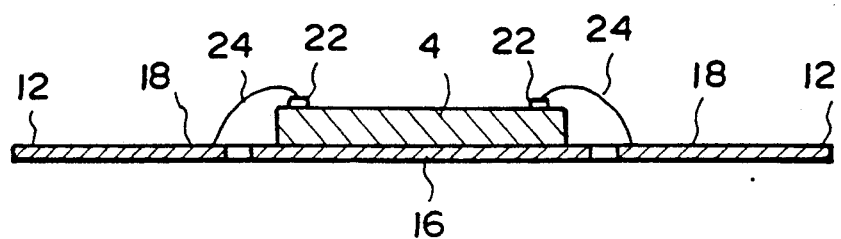

Referring to FIGS. 1A and 1B, reference numeral 2 denotes a planar lead frame made of an electrically conductive material, the thickness of which accounts for, for example, 0.15 mm. The lead frame 2 comprises a frame portion 12 of substantially rectangular form, a connecting portion 14 inwardly extending from four corners of the frame portion, an island portion 16 of rectangular form which, supported by the connecting portion, lies at the center and a multiplicity of external leads 18 which lie outwardly of four sides of the island portion while extending inwardly from the frame portion 12. The width of the external lead accounts for, for example, 0.3 mm. Formed through the frame portion 12 is a hole 20 for positioning when the working and conveyance are conducted.

First, as illustrated in FIGS. 1A and 1B, a semiconductor chip 4 having an electronic circuit already formed thereon is fixed on the island portion 16. This fixation can be conducted by, for example, silver paste. Each electrode pad 22 of the semiconductor chip and the corresponding inner end portion of the external lead 18 are connected by means of a metallic thin wire 24. As this metallic wire, a gold wire, for example, may be used.

Figure 2A:
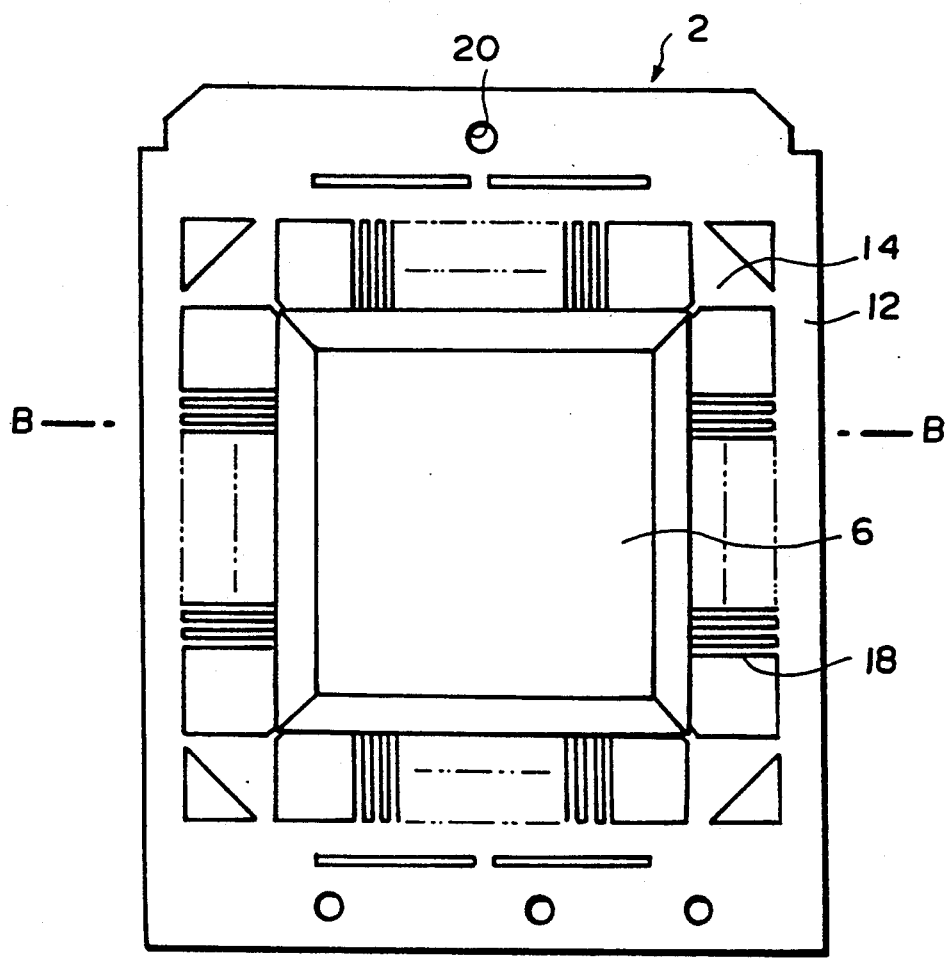
Figure 2B:
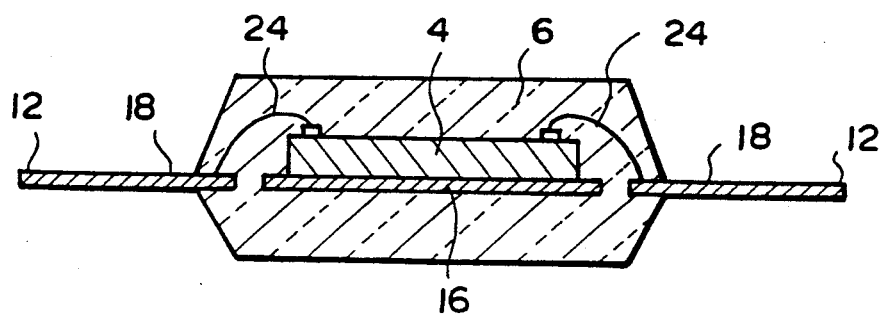

Next, as illustrated in FIGS. 2A and 2B, the semiconductor chip 4, island portion 16 and the inner end portion of the external lead 18 are sealed with a sealing plastic material 6. Thus, the metallic wire 24 may also be sealed. As the sealing plastic, an epoxy resin, for example, may be used.

Figure 3A:
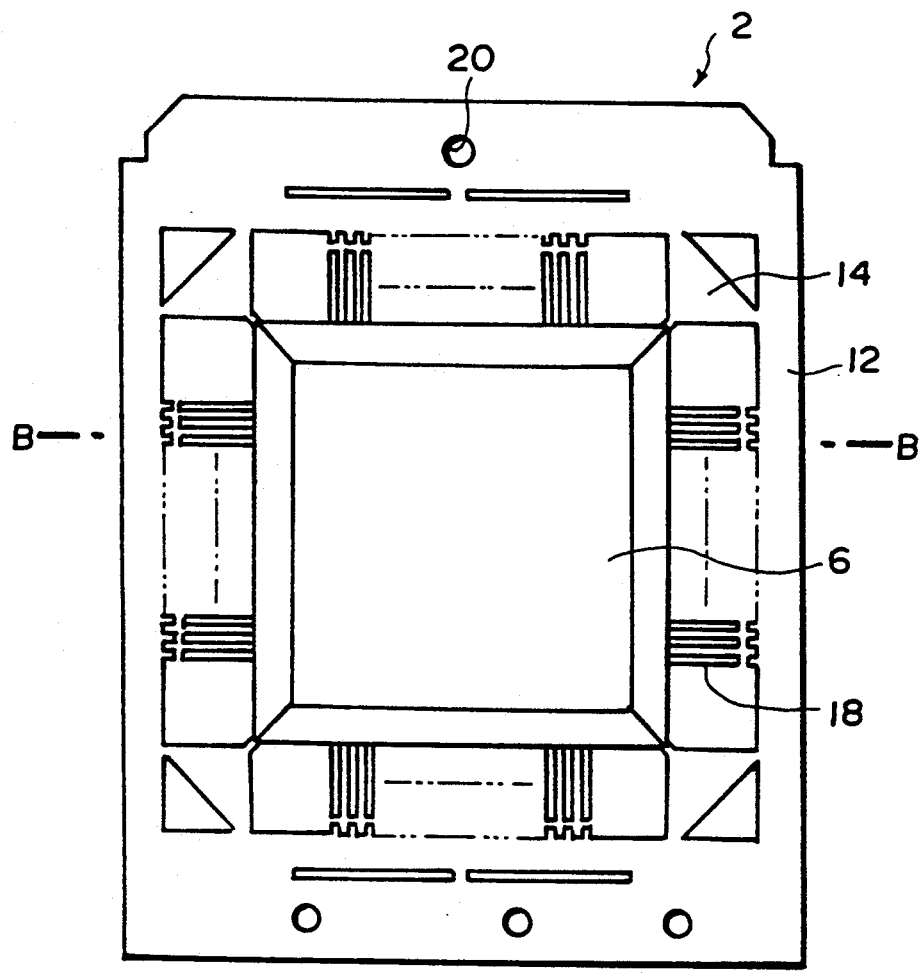
Figure 3B:
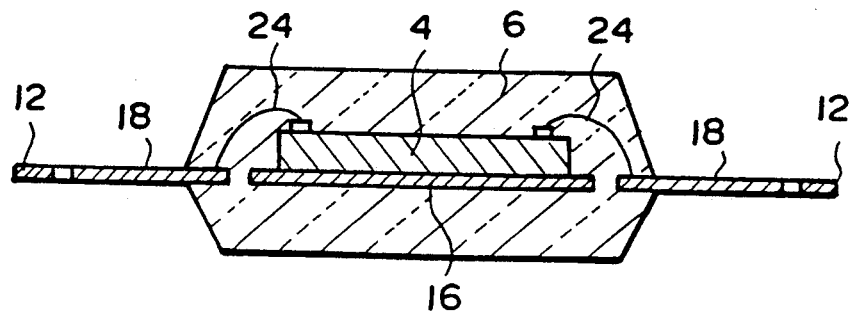

Next, as illustrated in FIGS. 3A and 3B, the external lead 18 is cut off and isolated from the frame portion 12. In consequence, the sealed semiconductor chip will be supported against the frame portion 12 by four connecting portions 14.

Figure 4:
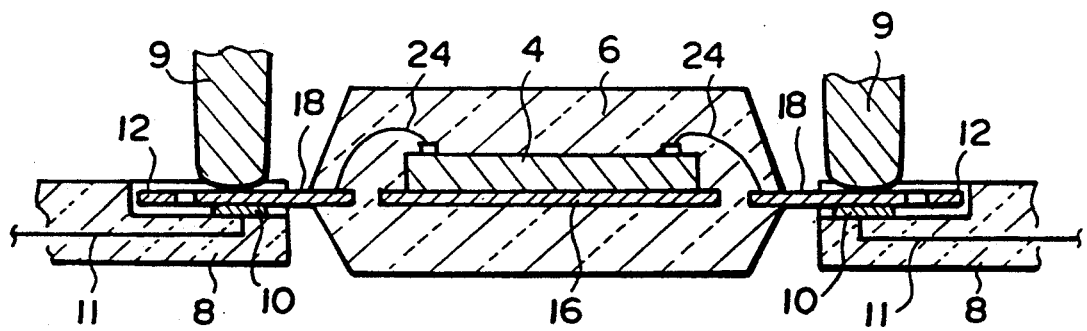

With this state, the electrical characteristic test is carried out. With this test, as shown in FIG. 4, the frame portion 12 and the external lead 18 are retained by means of a measuring jig, which is not electrically conductive. At the jig, a measuring terminal 10 is mounted corresponding to each external lead 18, and the above-described retaining allows the corresponding external lead and measuring terminal to come in contact with each other. Reference numeral 11 denotes a lead for electrically connecting the measuring terminal and the main body of the testing machine (not shown). Reference numeral 9 denotes a non-conductive pressure member to force the external lead 18 against the measuring terminal 10. In this test, since the external lead 18 is of rectilinear form, the external lead and the measuring terminal can be made to contact over a sufficiently long distance or a sufficiently wide surface so that an excellent electrical contact may be maintained. Further, since, when the test is carried out, the frame portion 12 lies outwardly of the external lead 18, which may protect the external lead 18, the chance for coming in contact with the external lead during handling is greatly reduced while the chance the external lead comes in contact with other members is also greatly reduced with the result that the danger of the external lead being deformed by bending, for example, is remarkably reduced.

Figure 5:
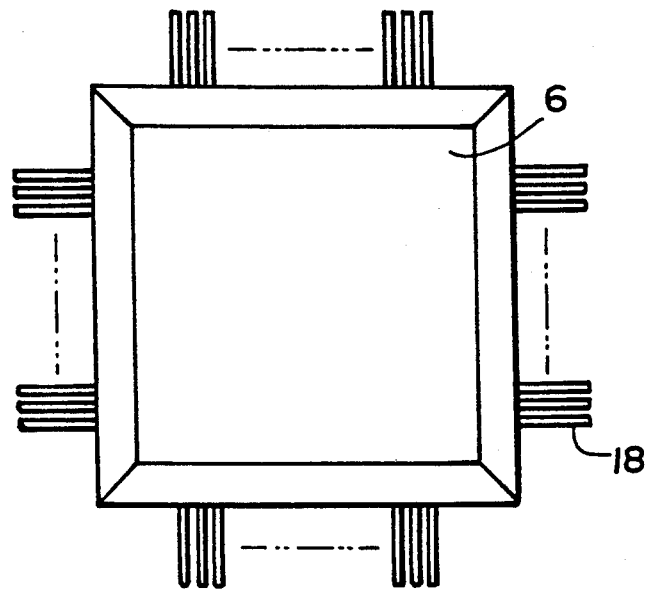

Next, as shown in FIG. 5, the connecting member exposed from the plastic material 6 is cut off to remove the connecting portion and the frame portion.

Figure 6:
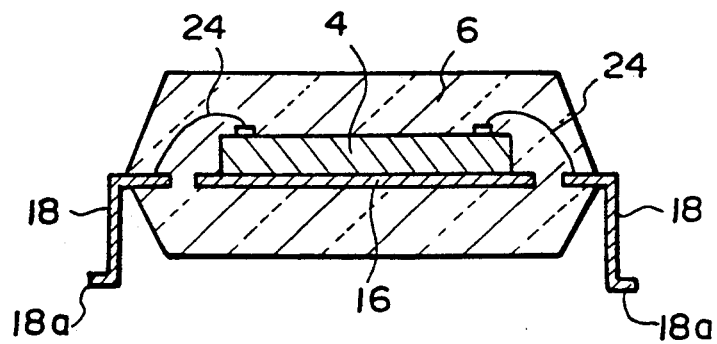

Finally, as shown in FIG. 6, as necessary, the external lead 18 is formed into a shape suitable for being mounted on the circuit substrate. That is, the external lead 18 is bent at a substantially right angle, and its tip end portion 18a is further outwardly bent.

Incidentally, according to the conventional test, since, after formed into the shape of FIG. 6, the tip end portion 18a of the external lead is made to contact the measuring terminal of the testing machine, the length of contact and the contact area are small.

The present invention is not necessarily restricted to the foregoing embodiments, but various modifications are possible within the scope and spirit of the invention defined in claims.

For example, some of the connecting portion 14 may be utilized as the additional external leads. That is, some of the connecting portions 14 may be made thin and long as in the external lead 18 and, at the time of the test, the additional external leads may be used as the terminal for grounding or applying the power voltage. The additional external leads may be left by a predetermined length protruding from the plastic material 6 when it is cut off to remove the frame portion (that is, it is left in a shape as in the external lead 18).

Further, it is also possible to remove the frame portion 12 and form the external lead 18 at the same time in the same process by using the same mold.

What is claimed is:

1. A method for conducting a reliability test relating to a semiconductor device of a quad flat package type, said device having a plurality of external leads protruding laterally from a plastic package and said leads being bent toward one side and into a form suitable for mounting a circuit substrate, said method comprising the steps of:

fixing a semiconductor chip to an island portion of a lead frame having an external lead extending inwardly from a frame portion toward the island portion, the island portion being supported via a connecting portion by the frame portion at the center thereof, connecting an electrode pad of the semiconductor chip and the inner end portion of the external lead by means of an electrically conductive wire, sealing the semiconductor chip with plastic together with the island portion and the inner end portion of the external lead, and cutting off the external lead from the frame portion; and the external lead being within the same plane as the frame portion of the lead frame and in contact with a measuring terminal of a testing machine to carry out the reliability test of electrical characteristics after subjecting the sample to certain environmental condition during a predetermined period of time which is sufficient to evaluate the reliability.

2. The method of testing a semiconductor device as set forth in claim 1 and the added step of forming said external lead after said connecting portion is cut off and said frame portion is removed.

3. The method of testing a semiconductor device as set forth in claim 1 and the added step of simultaneously cutting off said connecting portion to remove said frame portion and forming said external lead.

4. The method of testing a semiconductor device as set forth in claim 1 and the added step of cutting off at least one of said connecting portions leaving a portion protruding from the sealing plastic to use this protruding connection portion as an additional external lead.

* * * * *